(12) United States Patent
Xue

(10) Patent No.: US 7,777,544 B2
(45) Date of Patent: Aug. 17, 2010

(54) SYSTEM AND METHOD TO DETECT ORDER AND LINEARITY OF SIGNALS

(75) Inventor: Bin Xue, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/059,923

(22) Filed: Mar. 31, 2008

(65) Prior Publication Data

US 2009/0243661 A1    Oct. 1, 2009

(51) Int. Cl.
*H03H 11/26* (2006.01)

(52) U.S. Cl. ............... 327/261; 327/158; 327/265; 327/276

(58) Field of Classification Search ............ None
See application file for complete search history.

(56) References Cited

U.S. PATENT DOCUMENTS 6,182,236 B1* 1/2001 Culley et al. ............... 713/503
6,999,547 B2* 2/2006 Braceras et al. ............ 375/371
7,009,433 B2* 3/2006 Zhang et al. ............... 327/158
7,072,433 B2* 7/2006 Bell .......................... 375/376
7,336,752 B2* 2/2008 Vlasenko et al. ........... 375/376

* cited by examiner

*Primary Examiner*—An T Luu
(74) *Attorney, Agent, or Firm*—Blakely, Sokoloff, Taylor & Zafman LLP

(57) ABSTRACT

A method comprises applying a first delay to a first signal that is ahead of a second signal in a series of signals and determining a first number of delay units that provides the first delay to change an order between the delayed first signal and the second signal that has a phase difference with the first signal. The method further comprises determining a similar number for any other pair of signals in the series of signals that have the phase difference. The method further comprises determining a maximum and a minimum from the obtained numbers and determining linearity of the seriels of signals based on a difference between the maximum and the minimum.

14 Claims, 4 Drawing Sheets

US 7,777,544 B2

SYSTEM AND METHOD TO DETECT ORDER AND LINEARITY OF SIGNALS

BACKGROUND

Computing systems may utilize one or more clock signals that may each be provided by a clock circuit. Examples of the clock circuits may comprise delay locked loop, phase interpolator or any other clock circuit. A clock signal may have a phase and may be spaced apart with a subsequent clock signal by a phase difference or an time interval. Several factors may impact operation of the computing systems, including whether the clock signals provided to the computing systems are in order or linearity of the clock signals.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
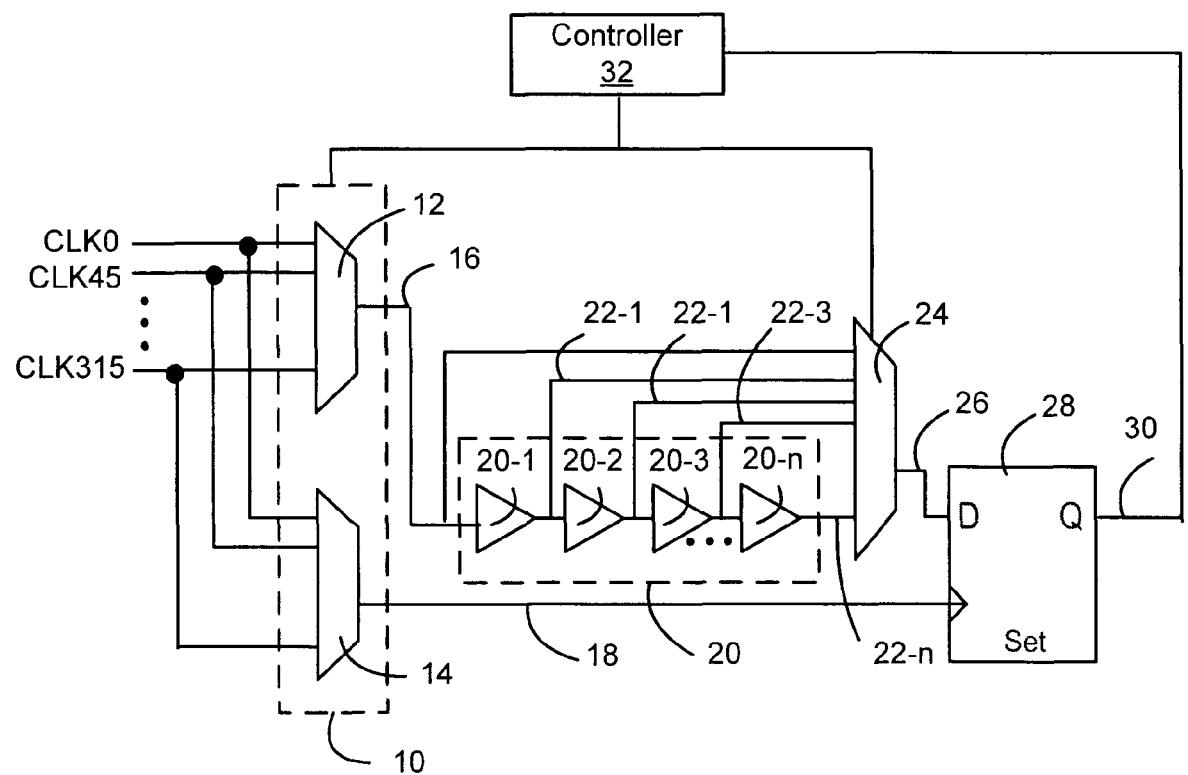
FIG. 1 is a schematic diagram of an embodiment of a system that may be used detect linearity of a series of signals.

In the following detailed description, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numbers refer to the same or similar functionality throughout the several views.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

The following description may include terms, such as first, second, etc. that are used for descriptive purposes only and are not to be construed as limiting.

FIG. 1 illustrates an example embodiment of a system 100 that may be used to detect an order of a series of signals and/or linearity of the series of signals. In one embodiment, the system 100 may compare two signals of the series of signals one by one. For example, FIG. 1 illustrates eight clock signals CLK0 to CLK 315; however, in some embodiments, a different number of signals may be detected. In one embodiment, a signal may have a phase. In one embodiment, the system 100 may comprise a selecting logic 10 that may select two signals to be compared from the series of signals. The selecting logic 10 may comprise a first selector 12 and a second selector 14. In one embodiment, the selecting logic 10 may select the two signals to be compared, e.g., based on a phase difference between the two signals.

For example, the first selector 12 may select a first signal 16 from the series of signals and the second selector 14 may select a second signal 18 from the series of signals, e.g., based on a first phase of the first signal 16 and a second phase of the second signal 18. In another embodiment, the selected first signal 16 and second signal 18 may have a phase difference. In another embodiment, the first signal 16 may be ahead of the second signal 18 in phase. For example, the first signal 16 may be, e.g., 45 degrees or 90 degrees ahead of the second signal 18; however, in some embodiments, two signals with other phase difference may be selected to be compared. In one embodiment, the first signal 16 and the second signal 18 may be neighboring signals in phase, in another embodiment, the first signal 16 and the second signal 18 may not be neighboring signals in phase. For example, the first signal 16 and the second signal 18 may be one or more signals apart.

Figure 4:
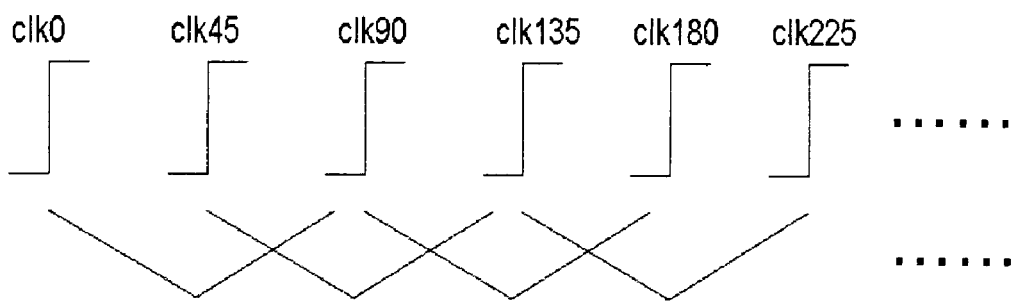
FIG. 4 is a schematic diagram of an embodiment of a series of signals that may have one or more pairs of signals to be compared.

For example, referring to FIG. 1, in one embodiment, the selecting logic 10 may select a first clock signal CLK0 and a second clock signal CLK45 as a first pair of signals to be compared and may select the second clock signal CLK45 and a third clock signal CLK90 as a second pair of signals to be compared, and so on. In another embodiments, the selecting logic 10 may select the first clock signal CLK0 and the third clock signal CLK90 as a first pair of signals to be compared and may select the second clock signal CLK45 and a third clock signal CLK135 as a second pair of signals to be compared, and so on, as shown in FIG. 4. However, the selecting logic 10 may select two signals to be compared based on a different phase difference. In another embodiment, the selecting logic 10 may couple to a controller 32 that may control the selecting logic 10 to select two signals to be compared based on a phase difference between the two signals.

Examples of the first selector 12 or the second selector 14 may comprise multiplexer or any other selecting circuit or logic. In one embodiment, the first selector 12 and the second selector 14 may be separate circuits or logic, and in another embodiment, the first selector and second selector 14 may be a single circuit or logic. In one embodiment, the first selector 12 and the second selector 14 may couple to a clock circuit (not shown) that may provide a series of signals to be detected. Examples of the clock circuit may comprise delay locked loop (DLL), phase interpolator (PI) or any other clock circuit. In one embodiment, the clock circuit may be coupled to a computing system.

Referring to FIG. 1, the system 100 may further comprise delay logic 20 that may selectively provide a delay to the first signal 16, e.g., CLK0, from the first selector 12. The delay logic 20 may comprise a set of one or more delay units 20-1 to 20-n, wherein n may equal to any positive integer. In one embodiment, a delay unit may provide a delay to the first signal 16. For example, the delay unit may provide a delay to the first signal 16, CLK0 that is ahead of the second signal 18, e.g., CLK45 in phase. In another embodiment, a first delay unit 20-1 may provide a delay that may be the same as that provided by a nth delay unit 20-n; however, in some embodiments, delay units that may provide different delays may be utilized. In one embodiment, n delay units may provide a total delay that may be longer than or equal to an interval or a time difference between the two signals to be detected. An example of a delay unit may comprise a buffer; however, in some embodiments, other delay circuit or logic may be utilized. In another embodiment, n delay units may provide a total delay that may provide a change in an order between the first signal 16 and the second signal 18.

With reference to FIG. 1, the system 100 may further comprise a third selector 24. In one embodiment, the third selector 24 may select one signal from a first signal 16 and a set of delayed outputs 22-1 to 22-n. For example, the third selector 24 may provide one or more of the first signal 16 and a set of the delayed first signal 22-1 to 22-n to the comparator 28 in order. The delay logic 20 may provide the selected signal as a selected output 26 to a comparator 28. The comparator 28 may further couple to the second selector 14 to detect an order of the selected signal 26 and the second signal 18. For example, the comparator 28 may detect whether the selected signal 26 arrives the comparator 28 ahead of the second signal 18. One example of the comparator 28 may comprise a flip-flop, a trigger, a phase detector; however, in some embodiments, any other detecting circuit or logic may be utilized to detect whether the selected signal 26 arrives earlier than the second signal 18.

In one embodiment, the comparator 28 may provide an output 30 (e.g., at Q output) that may have a first logic value, in response to detecting that an order between the first signal 16 and the second signal 18 is unchanged or the same as a phase order between the first signal 16 and the second signal 18, e.g., the selected output 26 arrives at the comparator 28 (e.g., at D input) before arrival of the second signal 18 (e.g., at a clock input of the comparator 28). In another embodiment, the comparator 28 may provide the output 30 that may have a second logic value, in response to detecting a change in an order between the first signal 16 and the second signal 18, e.g., the first signal 16 that has a selected delay arrives at the comparator 28 at the same time as or later than the second signal 18. In one embodiment, the comparator 28 may couple to a controller 32 that may control the selecting logic 10 and the third selector 24 based on the output 30. In one embodiment, the first logic value and the second logic value may be different. In another embodiment, the first logic value may correspond to a logic "low" and the second logic value may correspond to logic "high"; however, in some embodiments, other suitable logic values may be used.

Figure 2:
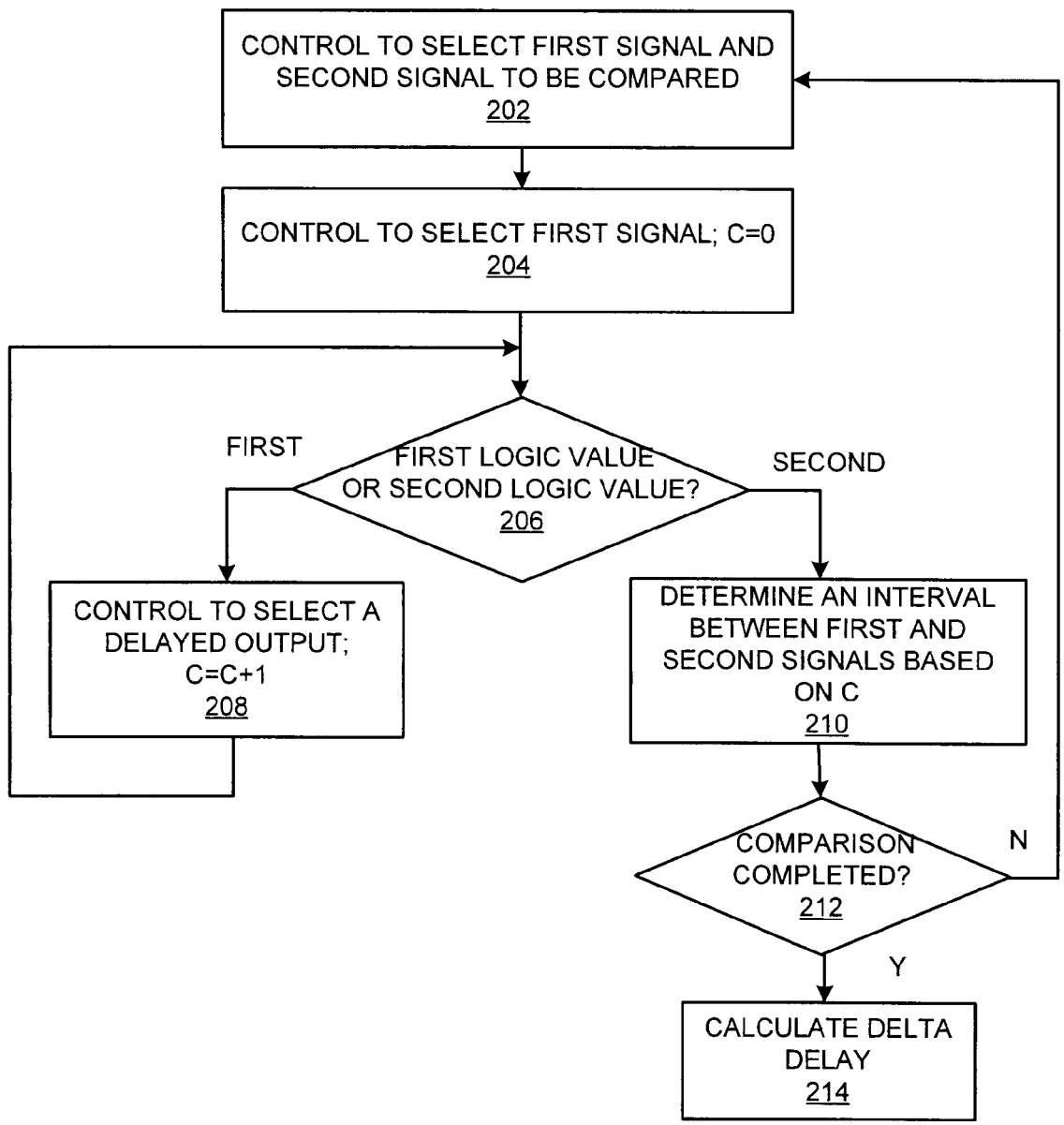
FIG. 2 is a schematic diagram of an embodiment of a method that may be used to detect linearity of a series of signals.

FIG. 2 illustrates a flow chart of a method that may be utilized by, e.g., the controller 32 to detect, e.g., whether a series of signals are in order and/or linearity of the series of signals. Referring to FIG. 1, in one embodiment, the controller 32 may couple to the selecting logic 10. In one embodiment, the controller 32 may control the selecting logic 10 to select a pair of signals to be compared (block 202). In one embodiment, in block 204, the controller 32 may control the third selector 24 to select the first signal 16 as the selected output 26. In one embodiment, a parameter C may be used to represent a number of delay units that may provide a delay to change an order of the first signal 16 and the second signal 18. For example, the controller 32 may let the parameter C be equal to 0; however, in some embodiments, a different number may be utilized (block 202). In diamond 206, the controller 32 may determine a logic value of the output 30.

In block 208, in response to determining that the output 30 has the first logic value or the order change between the first signal 16 and the second signal 18 is unavailable, the controller 32 may control the third selector 24 to sequentially select and provide one delayed output as the selected output 26, e.g., in an order from the first delayed output 22-1 to the nth delayed output 22-n. For each selected output 26, the flow may go back to block 206 to determine a logic value of the output 30. In another embodiment, the controller 32 may increase the parameter C by one (block 208).

For example, in block 208, the controller 32 may control the third selector 24 to provide the first delayed output 22-1 to the comparator 28 and the parameter C may equal to one. The controller 32 may then control the third selector 24 to provide the second delayed output 22-2 to the comparator 28 and the parameter C may equal to two, and so on (block 208), in response to determining that the output 30 has the first logic value (diamond 206). In block 210, in response to determining that the output 30 has the second logic value, the controller 32 may determine a corresponding value of C. In one embodiment, the controller 32 may determine an interval or a time difference between the first signal 16 and the second signal 18 based on the parameter C. In block 212, the controller 32 may determine if the comparison is completed. For example, the controller 32 may determine if there is a subsequent pair of signals to be compared.

In one embodiment, in response to determining that the subsequent pair of signals to be compared are available, the flow may go back to block 202 to determine a corresponding value of the parameter C for the subsequent pair of signals. In block 214, the controller 32 may calculate a delta delay, in response to determining that the comparison is completed. For example, DELTA DELAY=Max C−Min C, wherein Max C may represent a maximum value of the parameter C that may be correspond to one pair of compared signals and Min C may a minimum value of the parameter C that may be correspond to the other pair of compared signals.

Figure 3A:
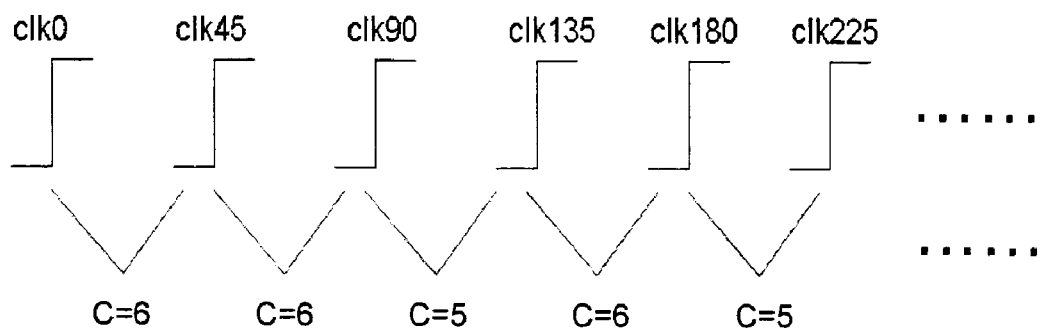
FIGS. 3A and 3B each is a schematic diagram of an embodiment of a result that may be obtained from a series of signals.
Figure 3B:
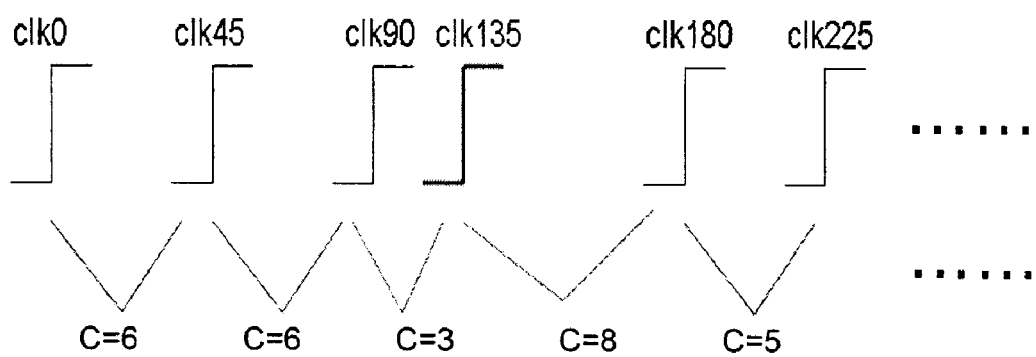

In another embodiment, the controller 32 may determine linearity of the series of signals based on the delta delay. FIGS. 3A and 3B each illustrates an example of a result that may be detected from a series of signals. Referring to FIG. 3A, the delta delay=6−5=1 may be obtained. In another embodiment, referring to FIG. 3B, the delta delay=8−3=5 may be obtained. In one embodiment, it may be determined that the example of FIG. 3A may have a higher linearity than the series of signals in FIG. 3B. In yet another embodiment, the controller 32 may compare a delta delay for a series of signals with a predetermined threshold to determine linearity of the signals.

Figure 5:
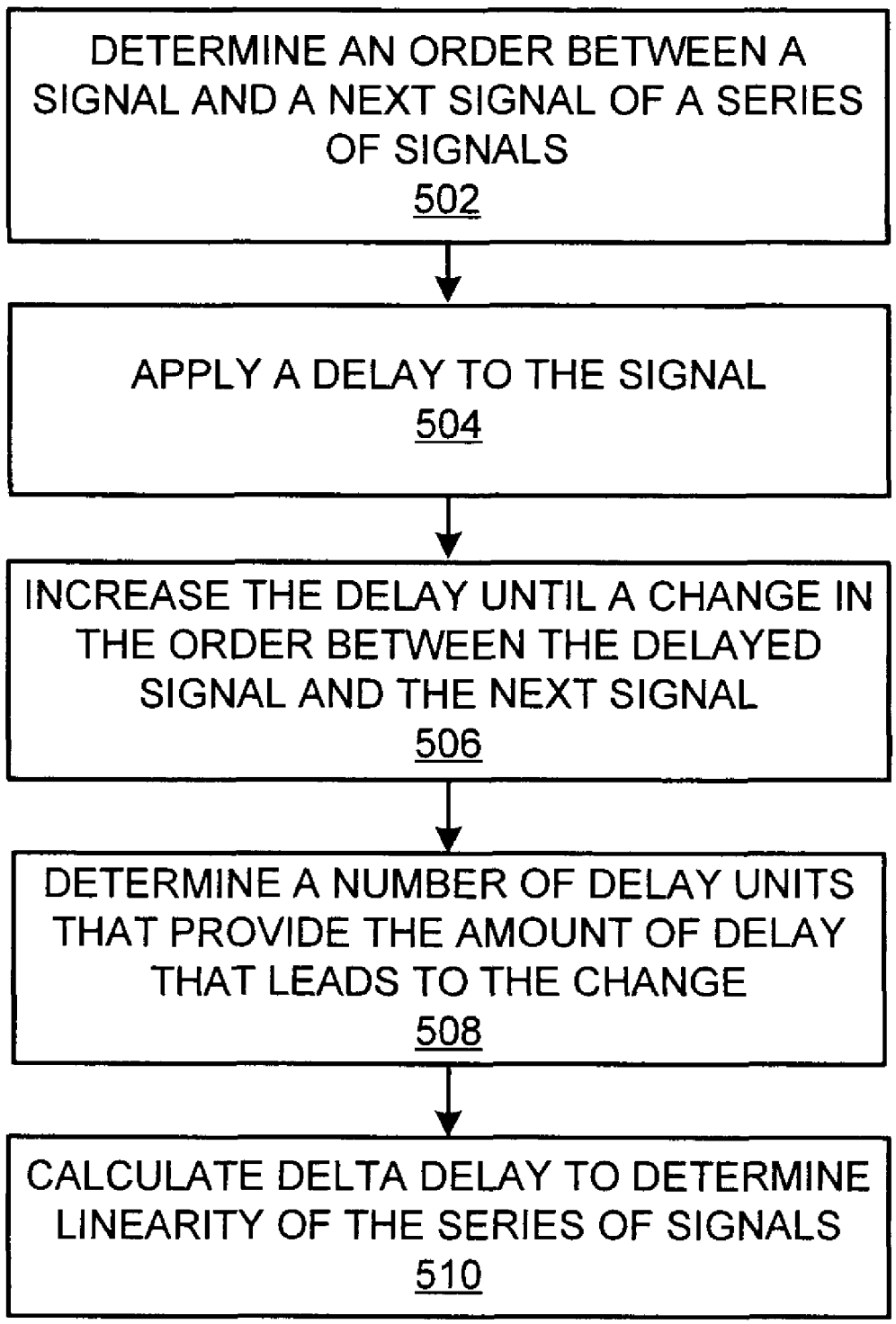
FIG. 5 is a flow chart of an embodiment of a method that may be used to detect whether a series of signals are in order and linearity.

FIG. 5 illustrates a method that may be used to determine whether a series of signals are in order and linearity in the series of signals. For example, in one embodiment, the series of signals CLK0 to CLK315 may be used to describe the method of FIG. 5; however, in some embodiments, any other signals may be utilized, including phase signals, clock signals, DLL signals, phase interpolation signals. In block 502, the method may comprise determining an order between a signal CLK0 and a next signal CLK45; however, in some embodiments, any other two signals that have a predetermined phase difference or interval may be selected. In one embodiment, it may be assumed that signal CLK0 may be ahead of signal CLK45 in phase. In block 504, a delay may be applied to signal CLK0. The order between the delayed signal CLK0 and the next signal CLK45 may be determined. In another embodiment, a comparator 28 may be used to detect an order between the delayed signal CLK0 and the next signal CLK45. In another embodiment, the comparator 28 may detect whether the time interval between the delayed signal CLK0 and the next signal CLK45 approaches or equals to zero.

In block 506, the delay provided to the signal CLK0 may be increased until it is determined a change in an order between the delayed signal CLK0 and the next signal CLK45. In another embodiment, the delay provided to the signal CLK0 may be increased until it is determined that the time interval between the delayed signal CLK0 and the next signal CLK45 approaches or equals to zero. In block 508, the flow may determine a number of delay units that may provide the delay corresponding to the change or the time interval. In another embodiment, the flow may determine the delay corresponding to the change or the time interval. Similarly, the method may comprise obtaining a similar number of delay units or delay for each of any other pairs of signals (such as CLK45/CLK90, CLK90/CLK135, CLK135/CLK180, and so on) in the series of signals CLK0 to CLK315, e.g., as shown in FIG. 3A. In block 510, the method may comprise calculate a delta delay based on the numbers or delays obtained in block 508, e.g., according to the equation as mentioned in above embodiments. In one embodiment, linearity may be determined based on the delta delay.

While FIGS. 3A and 3B illustrates an embodiment to compare a pair of neighboring signals, some embodiments may compare a pair of signals that may have any other phase difference or interval, e.g., CLK0 and CLK90 as shown in FIG. 4. Some embodiments may select a pair of signals that may be one or more steps apart. While FIG. 2 illustrates an embodiment to calculate delta delay based on a number of delay units that may lead to the delayed first signal 16 arrives at the comparator 28 later than or at the same time as the second signal 18, in some embodiments, the controller 32 may calculate delta delay and/or interval based on an amount of delay that may be provided by the delay units. While an embodiment of FIGS. 2 and 5 are illustrated to comprise a sequence of processes, the methods in some embodiments may preform illustrated processes in a different order.

An example of the controller 32 may comprise a microprocessor, a digital signal processor, a microcontroller, or any other processors; however, in some embodiments, in some embodiments, the controller 32 may be performed by hardware, firmware, software (including microcode), or a combination thereof. For example, the controller 32 may be realized by software stored on hard disk or any other storage device. In another embodiment, functions of the controller 32 may be performed or partially performed in one or more of the selecting logic 10 and the third selector 24. While FIG. 1 illustrates that an embodiment of the system 100 may comprise separate circuits or logic, and in another embodiment, system 100 may performed in a single circuit or logic.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. A system comprising,
   a selecting logic to select a first signal with a first phase and a second signal with a second phase, a phase difference between the first signal and the second signal causing an order between the first signal and the second signal;
   a delay logic that comprises a set of one or more delay units to provide a set of one or more delayed first signals;
   a selector to sequentially select one from the set of delayed first signals;
   a comparator to detect an change of the order between the selected first delayed signal and the second signal;
   a controller to control the selector to provide a subsequent delayed signal with an increased delay from the set of the delayed first signals to the comparator, in response to determining that the change is unavailable.

2. The system of claim 1, wherein in response to determining that the change is available, the controller is further to control the selecting logic to provide the second signal to the delay logic that provides a set of one or more delayed second signals and to provide a third signal with a third phase to the comparator, a phase difference between the second signal and the third signal causing an order between the second signal and the third signal, and the controller is further to control the selector to sequentially provide one of the delayed second signals to the comparator to determine an change of the order between the selected delayed second signal and the third signal.

3. The system of claim 2, wherein the controller is to determine a first number of delay units that lead to the change of the order between the selected delayed first signal and the second signal and to determine a second number of delay units that lead to the change of the order between the selected delayed second signal and the third signal, the controller is further to determine linearity of the first signal, the second signal and the third signal based on a difference of the first number and the second number.

4. The system of claim 2, wherein the controller is to determine a first delay that lead to the change of the order between the selected delayed first signal and the second signal and to determine a second delay that lead to the change of the order between the selected delayed second signal and the third signal, the controller is further to determine linearity of the first signal, the second signal and the third signal based on a difference of the first delay and the second delay.

5. A method, comprising:
   selecting a first signal with a first phase and a second signal with a second phase, a phase difference between the first signal and the second signal causing an order between the first signal and the second signal;
   providing a first delay to the first signal;

determining a first number of delay units that provides the first delay to lead to a change in the order between the delayed first signal and the second signal; and increasing the first delay, in response to determining that the change of the order is unavailable.

6. The method of claim 5, comprising:

in response to determining that the change of the order is available, selecting a third signal with a third phase, a phase difference between the second signal and the third signal causing an order between the second signal and the third signal;

providing a second delay to the second signal;

determining a second number of delay units that provides the second delay to change the order between the delayed second signal and the third signal; and increasing the second delay, in response to determining that the change of the order between the delayed second signal and the third signal is unavailable.

7. The method of claim 6, comprising:

determining linearity of the first signal, the second signal and the third signal based on a difference between the first number and the second number.

8. The method of claim 6, comprising:

in response to determining that the change of the order between the delayed second signal and the third signal is available, selecting a fourth signal with a fourth phase, a phase difference between the third signal and the fourth signal causing an order between the third signal and the fourth signal;

providing a third delay to the third signal;

determining a third number of delay units that provides the third delay to change the order between the delayed third signal and the fourth signal; and increasing the third delay, in response to determining that the change of the order between the delayed third signal and the fourth signal is unavailable.

9. The method of claim 8, comprising:

determining a maximum and a minimum from the first number, the second number and the third number; and determining linearity of the first signal, the second signal, the third signal and the fourth signal based on a difference between the maximum and the minimum.

10. A machine readable medium comprising a plurality of instructions that in response to being executed result in a computing device selecting a first signal with a first phase and a second signal with a second phase a phase difference between the first signal and the second signal causing an order between the first signal and the second signal;

applying a first delay to the first signal that is ahead of second signal;

determining a first number of delay units in response to determining that the first delay is to change the order between the delayed first signal and the second signal; and increasing the first delay, in response to determining that the change of the order is unavailable.

11. The machine readable medium of claim 10, further comprising a plurality of instructions that in response to being executed result in a computing device in response to determining that the change of the order between the delayed first signal and the second signal is available, selecting a third signal with a third phase, a phase difference between the second signal and the third signal causing an order between the second signal and the third signal;

applying a second delay to the second signal that is ahead of the third signal;

determining a second number of delay units that provides the second delay to the second signal to change the order between the delayed second signal and the third signal; and increasing the second delay, in response to determining that the change of the order between the delayed second signal and the third signal is unavailable.

12. The machine readable medium of claim 11, further comprising a plurality of instructions that in response to being executed result in a computing device determining linearity of the first signal, the second signal and the third signal based on a difference between the first number and the second number.

13. The machine readable medium of claim 11, further comprising a plurality of instructions that in response to being executed result in a computing device selecting a fourth signal with a fourth phase, a phase difference between the third signal and the fourth signal causing an order between the third signal and the fourth signal;

applying a third delay to the third signal that is ahead of the fourth signal;

determining a third number of delay units that provides the third delay to change the order between the delayed third signal and the fourth signal; and increasing the third delay, in response to determining that that the change of the order between the delayed third signal and the fourth signal is unavailable.

14. The machine readable medium of claim 13, further comprising a plurality of instructions that in response to being executed result in a computing device determining a maximum and a minimum from the first number, the second number and the third number; and determining linearity of the first signal, the second signal, the third signal and the fourth signal based on a difference between the maximum and the minimum.

* * * * *